United States Patent [19]

Tanaka et al.

[11] Patent Number: 4,791,321
[45] Date of Patent: Dec. 13, 1988

[54] CMOS OUTPUT CIRCUIT DEVICE

[75] Inventors: Yasunori Tanaka; Yukinori Uchino, both of Yokohama; Hideo Hashimoto, Tokyo, all of Japan

[73] Assignees: Kabushiki Kaisha Toshiba, Kawasaki; Tosbac Computer System Co., Ltd., Tokyo, both of Japan

[21] Appl. No.: 888,369

[22] Filed: Jul. 23, 1986

[30] Foreign Application Priority Data

Dec. 27, 1985 [JP] Japan ................. 60-293209

[51] Int. Cl.$^4$ .................. H03K 17/60; H03K 19/094
[52] U.S. Cl. .................. 307/451; 307/296 R; 307/304; 307/475; 307/557; 307/559; 307/555
[58] Field of Search ............... 328/168; 307/264, 475, 307/555, 557–559, 451, 304, 296.8

[56] References Cited

U.S. PATENT DOCUMENTS

| | | |
|---|---|---|
| 3,651,340 | 3/1972 | Cliff ................. 307/451 |
| 3,716,723 | 2/1973 | Heuner et al. ........... 377/105 |
| 4,469,959 | 9/1984 | Luke et al. ............. 307/264 |
| 4,584,491 | 4/1986 | Ulmer ................. 307/475 |

OTHER PUBLICATIONS

C$^2$MOS Integrated Circuits Technical Data, pp. 162–164, Jan. 1981, Toshiba Corporation.

Primary Examiner—Stanley D. Miller
Assistant Examiner—Richard Roseen
Attorney, Agent, or Firm—Foley & Lardner, Schwartz, Jeffery, Schwaab, Mack, Blumenthal & Evans

[57] ABSTRACT

A signal output circuit device according to the present invention comprises a first MOS transistor whose conduction is controlled by the potential given to its gate terminal, and gives the high level potential that is supplied by a high level voltage source to the output terminal, a diode which is inserted between the high level voltage source and the first MOS transistor so as to have its forward direction in the direction from the high level voltage source to the first MOS transistor, a second MOS transistor whose conduction is controlled by the potential given to its gate terminal, and supplies the low level potential supplied by a low level voltage source to the output terminal, and a diode which is inserted between the low level voltage source and the second MOS transistor so as to have its forward direction in the direction from the second MOS transistor to the low level voltage source.

6 Claims, 5 Drawing Sheets

CMOS OUTPUT CIRCUIT DEVICE

BACKGROUND OF THE INVENTION

1. Field of the Invention

The present invention relates to an output circuit device, in particular to an output circuit device which can realize stabilization of the output potential and the supply potential.

2. Description of the Prior Art

In the recent semiconductor devices, the degree of integration and the density have been increased for the purpose of reducing the chip size, and also there is a trend toward increasing the speed of operation to improve the processing capability.

As a method of increasing the degree of integration and the density, one may mention the method of decreasing the width of the wiring that is formed of aluminum or the like to reduce the area occupied by the wiring in comparison to the area of the chip. However, when the width of the wiring is decreased, it leads to an increase in the inductive load of the wiring, namely, in the inductance.

On the other hand, as a method of increasing the speed, one may mention the method of increasing the size of the transistor in order to enhance the current driving capability. However, an increase in the transistor size will result in a reduction in its on-resistance.

As understood from the above discussion, by decreasing the wiring width and increasing the transistor size, there used to be generated problems that are caused by an increase in the inductive load and a reduction in the on-resistance. Referring to a prior example as shown in FIGS. 1(A)* and 1(B)*, these problems will be described next.

Figure 1A:
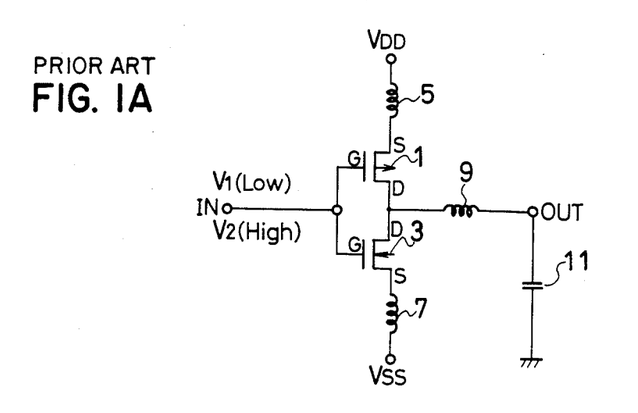
FIG. 1(A) is a block diagram for a prior output circuit device.
Figure 1B:
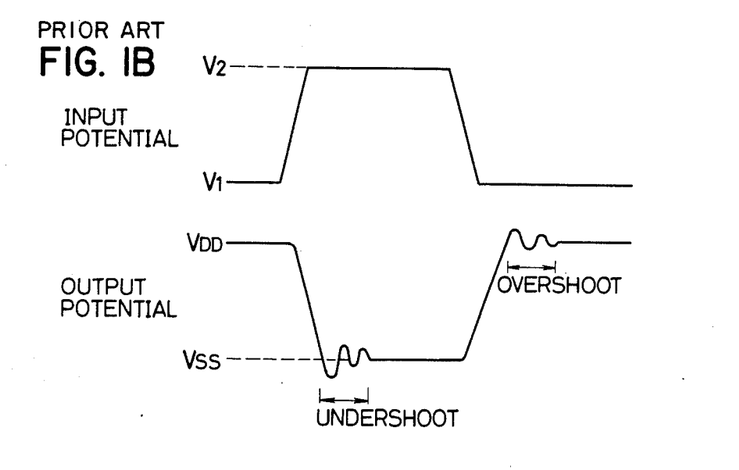
FIG. 1(B) is a characteristic diagram for illustrating the input and output characteristics of the output circuit device shown in FIG. 1(A)

FIG. 1(A) illustrates an example of a configuration of a general inverter circuit that takes into account the inductance components of a power source wiring and of the output wiring. The inverter circuit is composed of a P-channel MOS transistor (referred to as the "PMOS" hereinafter) 1 and an N-channel MOS transistor (referred to as the "NMOS" hereinafter) 3. The source terminal of the PMOS 1 is connected to a high level voltage source $V_{DD}$ that supplies a potential $V_{DD}$ via an inductance 5 of the power source wiring made of aluminum, and the source terminal of the NMOS 3 is connected to a low level voltage source $V_{SS}$ that supplies a potential $V_{SS}$ (ordinarily O V) via an inductance 7 of the power source wiring made of aluminum. Further, the gate terminals of both of the PMOS 1 and the NMOS 3 are connected to an input terminal IN to which is input a signal to be inverted, and the respective drain terminals are connected to an output terminal OUT via an inductance 9 of the output wiring formed of aluminum. In addition, a load capacity 11 is connected to the output terminal OUT.

Now, when a signal of low level state (potential $V_1$) is input to the input terminal IN, the PMOS 1 is brought to the conducting state and the NMOS 3 is brought to the nonconducting state. Consequently, a current flows in the load capacity 11 via the PMOSZ 1 from the high level voltage source $V_{DD}$, bringing the output terminal OUT to a high level state (potential $V_{DD}$). Further, when a signal of high level state (potential $V_2$) is input to the input terminal IN, the PMOS 1 is brought to the nonconducting state and the NMOS 3 is brought to the conducting state. Then, the charges that are accumulated in the load capacity 11 flow into the low level voltage source $V_{SS}$ via the NMOS 3, bringing the output terminal OUT to the low level state (potential $V_{SS}$). Therefore, by the action explained above, a signal which is the inversion of the signal that is input to the input terminal is output from the output terminal OUT.

Now, in an inverter circuit of such a configuration, when the current driving capability is enhanced by increasing the transistor size in order to invert the output potential at high speed, the on-resistance of the transistor is descreased. Then, between the high level voltage source $V_{DD}$ and the load capacity 11, and the low level voltage source $V_{SS}$ and the load capacity 11, there is formed a resonance circuit that consists of the inductance components of the power source wiring and the output wiring, the load capacity, and the on-resistance.

Because of this, the input potential is inverted from potential $V_{SS}$ to potential $V_{DD}$ as shown in FIG. 1(B), bringing the NMOS 3 to the conducting state. Then, the charges that are accumulated in the load capacity 11 flow rapidly into the low level voltage source $V_{SS}$, reducing the output voltage from potential $V_{DD}$ to potential $V_{SS}$. This generates the flow of a transient current in the vicinity of potential $V_{SS}$, causing the so-called undershoot phenomenon. In addition, also because of the ease of rise in the output potential from potential $V_{SS}$ potential $V_{DD}$ due to a rapid charging of the load capacity 11 by the influx of the current from the high level voltage source $V_{DD}$, a transient current flows in the vicinity of potential $V_{DD}$ causing the so-called overshoot phenomenon.

As a result, the output potential 11 fluctuates temporarily immediately after its inversion, and leads to the generation of a problem in which an erroneous signal for potential is transmitted. Further, there will be induced fluctuations in the potentials of the high level voltage source $V_{DD}$ and the low level voltage source $V_{SS}$, by which the input and output levels of other elements that are connected to the respective power source wirings are fluctuated also, giving rise to a fear of causing a malfunction of the circuit.

SUMMARY OF THE INVENTION

An object of the present invention is to provide an output circuit device which is capable of improving the stability of the output potential and the supply potential.

Another object of the present invention is to provide an output circuit device which is capable of preventing the malfunctions of the device through suppression of fluctuations in the output potential and the supply potential.

Another object of the present invention is to provide an output circuit device which is capable of suppressing the overshoot and the undershoot phenomena in the output potential and the supply potential.

Another object of the present invention is to provide an output circuit device which can supply a high level potential or a low level potential to the output terminal by the insertion of transistor between a voltage source and a MOS transistor and between another MOS transistor and another voltage source, so that it is possible to suppress the transient phenomena during the charging and discharging of the load capacity that is caused by the load capacity that is connected to the output terminal, the inductive load of the power source wiring, and the on-resistance of the MOS transistors.

Another object of the present invention is to provide an output circuit device which makes it possible to increase the degree of integration and density.

A special feature of the present invention is that an output circuit device according to the present invention comprises a first MOS transistor whose conduction is controlled by the potential given to its gate terminal, and gives the high level potential that is supplied by a high level voltage source to the output terminal, a diode which is inserted between the high level voltage source and the first MOS transistor so as to have its forward direction in the direction from the high level voltage source to the first MOS transistor, a second MOS transistor whose conduction is controlled by the potential given to its gate terminal, and supplies the low level potential supplied by a low level voltage source to the output terminal, and a diode which is inserted between the low level voltage source and the second MOS transistor so as to have its forward direction in the direction from the second MOS transistor to the low level voltage source.

Another special feature of the present invention is that in an inverter circuit formed on a first type semiconductor substrate, in the upper part of the first type semiconductor substrate, there are formed a second type MOS transistor that has one second type region as its source region and another second type region as its drain region, and a second type well region (second type well), and further, there is formed a first type MOS by creating a pair of first type regions formed in the second type well as its drain region and source region. Furthermore, in the upper part of the first type semiconductor substrate, there is formed a second type well region (second type well) which is separate from the second type well that is used for forming the first type MOS, and a PN junction is formed by forming a first type region in this second type region. That is, a diode is formed with the second type well as the anode region and the first type region as the cathode region. Moreover, the anode region is connected to the high level voltage source via the power source wiring, while the cathode region is connected to the source region of the second type MOS.

These and other objects, features and advantages of the present invention will be more apparent from the following description of the preferred embodiments, taken in conjunction with the accompanying drawings.

DESCRIPTION OF THE PREFERRED EMBODIMENTS

Figure 2A:
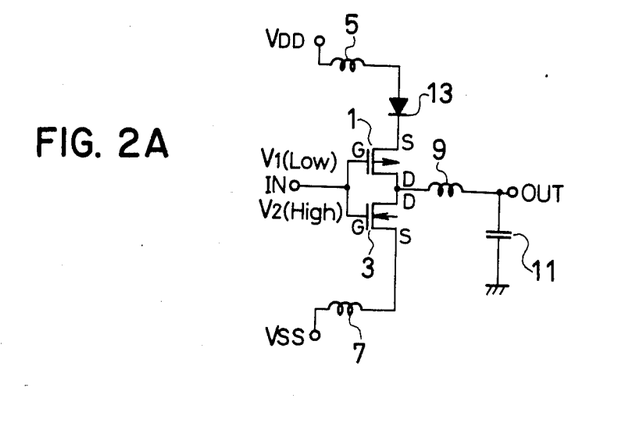
FIG. 2(A) is a block diagram for an output circuit device embodying the present invention.
Figure 2B:
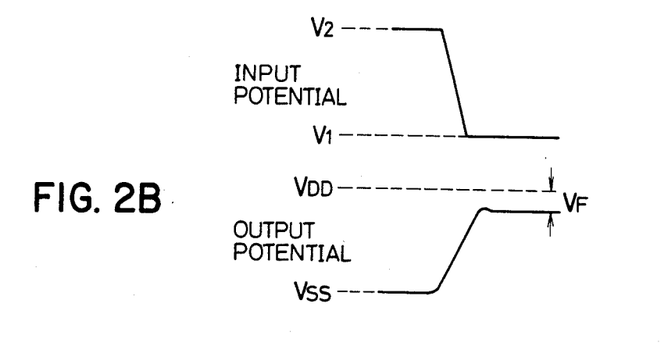
FIG. 2(B) is a characteristic diagram for illustrating the input and output characteristics of the output circuit device shown in FIG. 2(A)
Figure 2C:
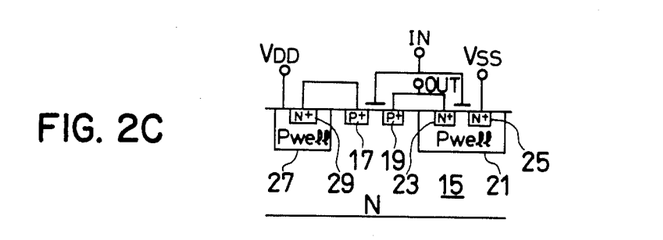
FIG. 2(C) is a sectional block diagram when the circuit shown in FIG. 2(A) is formed on a semiconductor substrate.

Referring to FIGS. 2(A), 2(B) and 2(C), there is shown an output circuit device which consists of a CMOS inverter circuit embodying the present invention. Here, the elements identical to those is the prior example shown in FIG. 1(A) will be given identical symbols to omit further explanation.

The inverter circuit has a diode 13 inserted in the forward direction between the high level voltage source $V_{DD}$ and the source terminal of the PMOS 1. The diode 13 has its cathode terminal connected to the source terminal of the PMOS 1, and its anode terminal connected to the high level voltage source $V_{DD}$ via the inductance 5 of the power source wiring.

In an inverter circuit with such a configuration, when the input potential that is given to the input terminal IN is inverted from the high level state to the lower level state, the PMOS 1 becomes conducting state while the NMOS 3 becomes nonconducting state. A current flows them from the high level voltage source $V_{DD}$ into the load capacity 11 which is connected to the output terminal OUT, via the diode 13 and the PMOS 1. As a result, the output potential will be raised to ($V_{DD}-V_F$) ($V_F$ is the forward voltage of the diode), as shown in FIG. 2(B), and the output terminal OUT becomes high level state.

In such an inversion operation of the input potential, the diode 13 is inserted between the high level voltage source $V_{DD}$ and the PMOS 1 so as to have the direction from the high level voltage source $V_{DD}$ the PMOS 1 as its forward direction, so that a transient current, in the vicinity of the potential $V_DD$ of the output potential, that flows from the source terminal of the PMOS 1 to the high level voltage source $V_{DD}$ can be prevented. Because of this, the overshoot phenomenon of the output potential caused by the inductance 5 of the power source wiring, the load capacity 11 that is connected to the output terminal OUT, and the on-resistance of the PMOS 1 can be relaxed.

FIG. 2(C) shows a schematic sectional structure which is obtained by forming the inverter circuit shown in FIG. 2(A) on an N-type semiconductor substrate 15. In the upper part of the N-type semiconductor substrate 15, there is formed a PMOS 1 with one of a pair of P+-type regions 17 as the source region and the other region 19 as the drain region. Further, in the upper part of the N-type semiconductor substrate 15, there is formed a P-type well region (P well) 21 is which are formed a pair of N+-type regions 23 and 25. An NMOS 3 is formed with the N+-type region 23 as the drain region and the N+-type region 25 as the source region.

Moreover, in the upper part of the N-type semiconductor substrate 15, there is formed a P-type well region (P well) which is separate from the P well 21 that forms the NMOS 3, and a PN junction is formed by the formation of an N+-type region 29 in the P well 27. Namely, a diode 13 is formed with P well 27 as the anode region and the N+-type region 29 as the cahtode region. The anode region is connected to the high level voltage source $V_{DD}$ the power source wiring, and the cathode region is connected to the source region of the PMOS 1. Therefore, it becomes possible to form easily a diode 13 between the source terminal of the PMOS 1 and the high level voltage source $V_{DD}$, with the direction from the high level voltage source $V_{DD}$ to the source terminal of the PMOS 1 as the forward direction, by means of the CMOS process technique which is in general use, along with the use of an N-type semiconductor substrate.

Figure 3A:
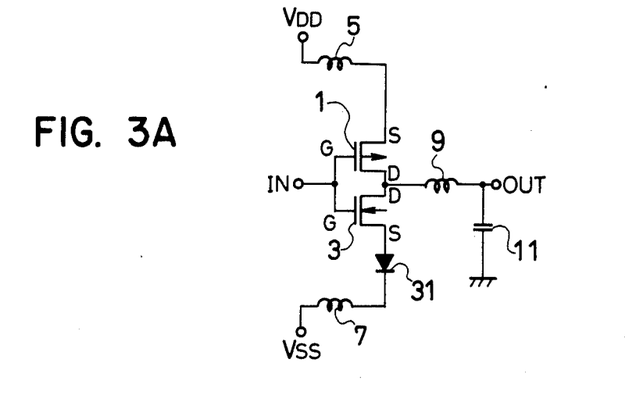
FIG. 3(A) is a block diagram for a second embodiment of the output circuit device embodying the present invention.
Figure 3B:
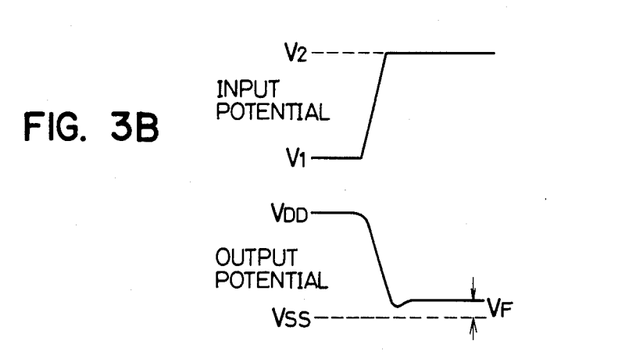
FIG. 3(B) is a characteristic diagram for illustrating the input and output characteristics of the output circuit device shown in FIG. 3(A)

FIG. 3(A) is a block diagram for the second embodiment of the output circuit device embodying the present invention. A feature of the second embodiment resides in that a diode 31 is inserted between the low level voltage source $V_{SS}$ and the source terminal of the NMOS 3, with the direction from the NMOS3 to the low level voltage source $V_{SS}$ as its forward direction. With such a configuration, it becomes possible, as shown in FIG. 3(B), to relax the undershoot phanomenon which occurs in the vicinity of potential $V_{SS}$ the output potential, in connection with the inversion operation from the high level state to the low level state.

Figure 3C:
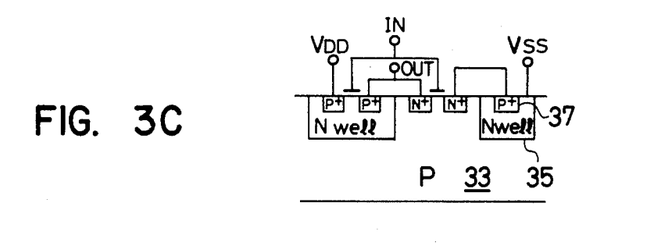
FIG. 3(C) is a sectional block diagram when the circuit shown in FIG. 3(A) is formed on a semiconductor substrate.

Here, the diode 31 in such a CMOS inverter can be formed easily and inserted between the source terminal of the NMOS 3 and the low level voltage source in the following manner. Namely, in a P-type semiconductor substrate 33 that is formed in a CMOS inverter circuit by the CMOS technique in general use, an N-type well region (N well) 35 is formed, and a P+-type region 37 is formed in the N well 35. The diode 31 can be formed by using the N well 35 as the cathode region, the P+-type region 37 as the anode region, and connecting the N well 35 to the low level voltage source $V_{SS}$ and the P+-type region 37 to the source terminal.

Figure 4A:
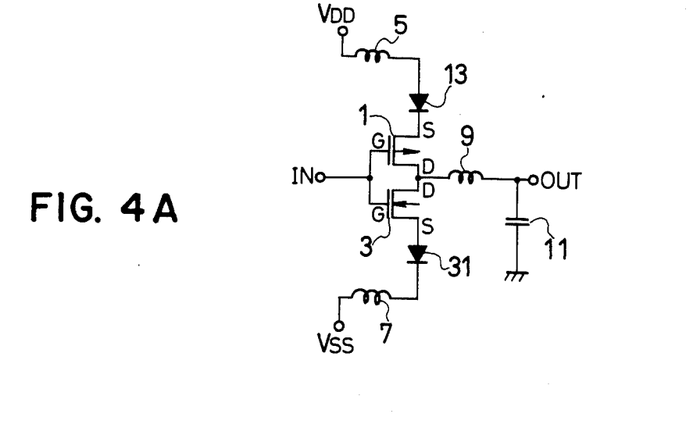
FIG. 4(A) is a block diagram for a third embodiment of the ouput circuit device embodying the present invention.

FIG. 4(A) is a block diagram for a third embodiment of the output circuit device embodying the present invention. A feature of the third embodiment is that a diode 13 is inserted between the high level voltage source $V_{DD}$ and the source terminal of the PMOS 1, with the direction from the high level voltage source $V_{DD}$ to the PMOS 1 as the forward direction, and a diode 31 is inserted between the low level voltage source $V_{SS}$ and the NMOS 3, with the direction from the NMOS 3 to the low level voltage source $V_{SS}$ as its forward direction.

Figure 4B:
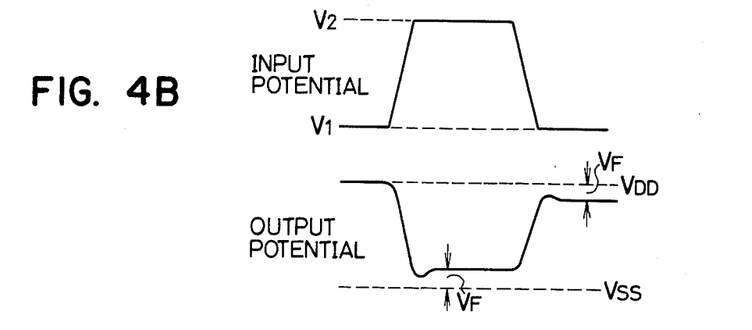
FIG. 4(B) is a characteristic diagram for illustrating the input and output characteristics of the output circuit device shown in FIG. 4(A)

By giving a configuration of this kind to the device, it is possible, in the inversion operation of the output potential, to relax the undershoot phenomenon in the vicinity of potential $V_{SS}$ of the output potential, and the overshoot phenomenon in the vicinity of potential $V_{DD}$ of the output potential, as shown in FIG. 4(B), and may be clear from the first and the second embodiments.

Figure 4C:
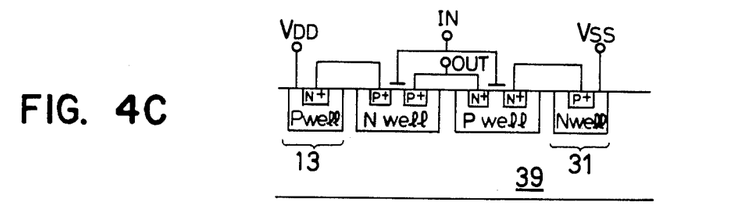
FIG. 4(C) is a sectional block diagram when the circuit shown in FIG. 4(A) is formed on a semiconductor substrate.

Moreover, such a CMOS incerter circuit and diodes 13* and 31 can be madew with ease by forming a double wall structure in a sapphire substrate 39 by, for example, the S.O.S. (silicon-on-sapphire) process technique.

Figure 5A:
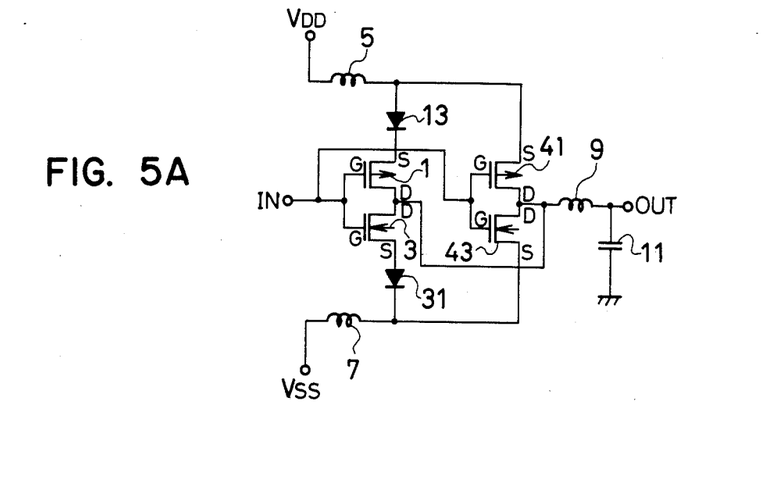
FIG. 5(A) is a block diagram for a fourth embodiment of the output circuit device embodying the present invention.

FIG. 5 is a block diagram for a fourth enbodiment of the output circuit device embodying the present invention. The output potential of the inverter circuit shown in FIG. 4 is $(V_{DD}-V_F)$ for the high level state and $(V_{SS}+V_F)$ for the low level state, due to the forward voltage $V_F$ of the diode, so that the output potential is not precisely equal to potential $V_{DD}$ level state and potential $V_{SS}$ for the low level state.

The fourth embodiment which is devised to improve this shortcoming has a feature that in the inverter circuit shown in FIG. 4(A), a CMOS inverter circuit formed by a PMOS 41 and an NMOS 43, and a CMOS inverter circuit formed by the PMOS 1 and the NMOS 3, are connected in parallel with respect to the output terminal OUT. With this set-up, it is arranged that the output potential can be raised to potential $V_{DD}$ by the action of the PMOS 41 and the output potential can be lowered to potential $V_{SS}$ by the action of the NMOS 43.

It should be noted here that the transistors PMOS 41 and NMOS 43 are to be formed in each a way as to have sizes that are considerably small compared with the sizes of the PMOS 1 and the NMOS 3, respectively, with due care on their sizes so as not to cause resonances due to their on-resistances.

Figure 5B:
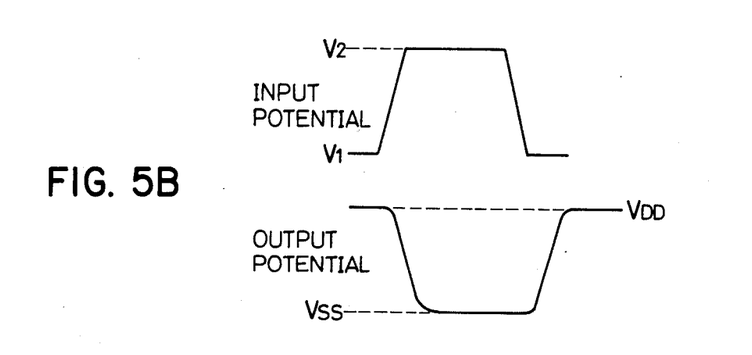
FIG. 5(B) is a characteristic diagram for illustrating the input and output characteristics of the output circuit device shown in FIG. 5(A).

With such a configuration, it becomes possible, analogons to the case of the third embodiment, to relax the overshoot and the undershoot phenomena of the output potential, in addition to the fact, as shown in FIG. 5(B), that the output potential can be set surely to potential $V_D$ potential $V_{SS}$.

In summary, according to the present invention, a high level potential or a low level potential is arranged to be supplied to the output terminal by the insertion of a dioe between a voltage source and a MOS transistor and/or between another MOS transistor and another voltage source. As a result, it becomes possible to suppress the generation of a transient current during the charging or the discharging of the capacity load that is caused by the capacity load that is connected to the output terminal, the inductive load of the power source wiring, and the on-resistances of the MOS transistors.

As a result, it becomes possible to suppress the overshoot and the undershoot phenomena in the output potential and the supply potential, leading to an improvement in the stability of the output potential and the supply potential.

Various modification will become possible for those skilled in the art after receiving the teachings of the present disclosure without departing from the scope thereof.

What is claimed is:

1. A signal output circuit device, comprising:
   a first type MOS transistor having a source, a control gate, and a drain;
   a second type MOS transistor having a source, a control gate, and a drain;
   the control gates of said first and second type MOS transistors being connected together to an input terminal, the source of said first type MOS transistor being connected to a first power supply having a first polarity, the source of said second type MOS transistor being connected to a second power supply having a second polarity, the drains of said first and second type MOS transistors being connected together so as to produce an output signal on a common line;
   a first diode which is inserted in the forward direction between the first power supply and the source of said first type MOS transistor;

a second diode which is inserted in the forward direction between the source of said second type MOS transistor and the second power supply; and a capacitor, one terminal of which is connected to said common output line and the other terminal of which is connected to ground, thereby suppressing both overshoot and undershoot phenomena when said first and second type MOS transistors are changed-over from one condition to the other condition in accordance with an input signal, wherein said first type MOS transistor is a P-MOS transistor and said second type MOS transistor is an NMOS transistor.

2. A signal output circuit device comprising:
a first type first MOS transistor having a source, a control gate, and a drain;
a second type second MOS transistor having a source, a control gate, and a drain;
a first type third MOS transistor having a source, a control gate, and a drain;
a second type fourth transistor having a source, a control gate, and a drain;
the control gates of said first type first MOS transistor and said second type second MOS transistor being connected together to an input terminal, the source of said first type first MOS transistor being connected to a first power supply having a first polarity, said source of the second type second MOS transistor being connected to a second power supply having a second polarity, the drains of said first and second type first and second MOS transistors being connected together in communication with a common output line, the control gates of said first and second type third and fourth MOS transistors being connected to the input terminal, the source of said first type third MOS transistor being connected to the first power supply having the first polarity, the source of said second type fourth MOS transistor being connected to the second power supply having the second polarity, and the drains of said first and second type third and fourth MOS transistors being connected together to the drains of said first and second type first and second MOS transistors;
a first diode which is inserted in the forward direction between the first power supply and the source of said first type first MOS transistor (1);
a second diode which is inserted in the forward direction between the source of said second type second MOS transistor and the second power supply; and
a capacitor, one terminal of which is connected to the common output line and the other terminal of which is connected to the ground, thereby suppressing both overshoot and undershoot phenomena and permitting the level of an output signal on the common output line to change both to the voltage value of the first power supply having the first polarity and to the voltage value of the second power supply having the second polarity when said first and second type first and second MOS transistors are changed-over from one condition to the other condition in accordance with an input signal.

3. A signal output circuit device as claimed in claim 2, further comprising:
a first inductance which is inserted between the first power supply and said first diode;
a second inductance which is inserted between the second power supply and said second diode; and
a third inductance which is inserted between the drains of said first and second type MOS transistors and the common output line.

4. Signal output circuit device, comprising:
a first type first MOS transistor having a source, a control gate, and a drain;
a second type second MOS transistor having a source, a control gate, and a drain;
a first type third MOS transistor having a source, a control gate, and a drain;
a second type fourth transistor having a source, a control gate, and a drain;
the control gates of said first type first MOS transistor and said second type second MOS transistor being connected together to an input terminal, the source of said first type first MOS transistor being connected to a first power supply having a first polarity, said source of the second type second MOS transistor being connected to a second power supply having a second polarity, the drains of said first and second type first and second MOS transistors being connected together in communication with a common output line, the control gates of said first and second type third and fourth MOS transistors being connected to the input terminal, the source of said first type third MOS transistor being connected to the first power supply having the first polarity, the source of said second type fourth MOS transistor being connected to the second power supply having the second polarity, and the drains of said first and second type third and fourth MOS transistors being connected together to the drains of said first and second type first and second MOS transistors;
a first diode which is inserted in the forward direction between the first power supply and the source of said first type first MOS transistor;
a second diode which is inserted in the forward direction between the source of said second type second MOS transistor and the second power supply; and
a capacitor, one terminal of which is connected to the common output line and the other terminal of which is connected to the ground, thereby suppressing both overshoot and undershoot phenomena and permitting the level of an output signal on the common output line to change both to the voltage value of the first power supply having the first polarity and to the voltage value of the second power supply having the second polarity when said first and second type first and second MOS transistors are changed-over from one condition to the other condition in accordance with an input signal,
wherein said first type MOS transistors are P-MOS transistors and said second type MOS transistors are N-MOS transistors.

5. A signal output circuit device, comprising:
a first type MOS transistor having a source, a control gate, and a drain;
a second type MOS transistor having a source, a control gate, and a drain;
the control gates of said first and second type MOS transistors being connected together to an input terminal, the source of said first type MOS transistor being connected to a first power supply having a first polarity, the source of said second type MOS transistor being connected to a second power supply having a second polarity, the drains of said first and second type MOS transistors being connected together so as to produce an output signal on a common line;

a first diode which is inserted in the forward direction between the first power supply and the source of said first type MOS transistor;

a second diode which is inserted in the forward direction between the source of said second type MOS transistor and the second power supply; and a capacitor, one terminal of which is connected to said common output line and the other terminal of which is connected to ground, thereby suppressing both overshoot and undershoot phenomena when said first and second type MOS transistors are changed-over from one condition to the other condition in accordance with an input signal, wherein semiconductor portions corresponding to said first and second diodes and the semiconductor portions corresponding to at least a pair of said first and second type MOS transistors are diffused on a common sapphire substrate in parallel with each other on said substrate.

6. A signal output circuit device, comprising:

a first type first MOS transistor having a source, a control gate, and a drain;

a second type second MOS transistor having a source, a control gate, and a drain;

a first type third MOS transistor having a source, a control gate, and a drain;

a second type fourth transistor having a source, a control gate, and a drain;

the control gates of said first type first MOS transistor and said second type second MOS transistor being connected together to an input terminal, the source of said first type first MOS transistor being connected to a first power supply having a first polarity, said source of the second type second MOS transistor being connected to a second power supply having a second polarity, the drains of said first and second type first and second MOS transistors being connected together in communication with a common output line, the control gates of said first and second type third and fourth MOS transistors being connected to the input terminal, the source of said first type third MOS transistor being connected to the first power supply having the first polarity, the source of said second type fourth MOS transistor being connected to the second power supply having the second polarity, and the drains of said first and second type third and fourth MOS transistors being connected together to the drains of said first and second type first and second MOS transistors;

a first diode which is inserted in the forward direction between the first power supply and the source of said first type first MOS transistor;

a second diode which is inserted in the forward direction between the source of said second type second MOS transistor and the second power supply; and a capacitor, one terminal of which is connected to the common output line and the other terminal of which is connected to the ground, thereby suppressing both overshoot and undershoot phenomena and permitting the level of an output signal on the common output line both to the voltage value of the first power supply having the first polarity and to the voltage value of the second power supply having the second polarity when said first and second type first and second MOS transistors are changed-over from one condition to the other condition in accordance with an input signal, wherein semiconductor portions corresponding to said first and second diodes and semiconductor portions corresponding to at least a pair of said first and second type MOS transistors are diffused on a common sapphire substrate in parallel with each other on said substrate.

* * * * *